United States Patent
Höfer

[11] 4,056,820
[45] Nov. 1, 1977

[54] REVERSIBLE ANALOG TO DIGITAL CONVERTER

[75] Inventor: Ernst Höfer, Munich, Germany

[73] Assignee: Siemens Aktiengesellschaft, Munich, Germany

[21] Appl. No.: 709,125

[22] Filed: July 27, 1976

[30] Foreign Application Priority Data

July 30, 1975 Germany .............................. 2534109

[51] Int. Cl.² ............................................ H03K 13/02
[52] U.S. Cl. ........................ 340/347 C; 340/347 AD; 340/347 DA; 179/15 A
[58] Field of Search ... 340/347 M, 347 AD, 347 DA, 340/347 C; 179/15 A

[56] References Cited

U.S. PATENT DOCUMENTS

| | | | |
|---|---|---|---|
| 2,950,348 | 8/1960 | Mayer | 340/347 C |
| 3,877,028 | 4/1975 | Thomas | 340/347 AD |
| 3,900,844 | 8/1975 | Wald | 340/347 C |

Primary Examiner—Charles D. Miller
Attorney, Agent, or Firm—Schuyler, Birch, Swindler, McKie & Beckett

[57] ABSTRACT

A switching arrangement for converting analog signals into digital signals, and vice versa, is described. Conversions between pulse amplitude modulated (PAM) and pulse code modulated (PCM) signals are performed. In telecommunication systems having subscriber stations equipped to transmit and receive analog signals it is necessary to carry out these conversions to facilitate PCM transmission. An analog to digital converter is thus provided at each subscriber station for converting received digital signals into analog signals and analog signals to be transmitted into digital signals; the converter utilizes the iterative principle.

5 Claims, 1 Drawing Figure

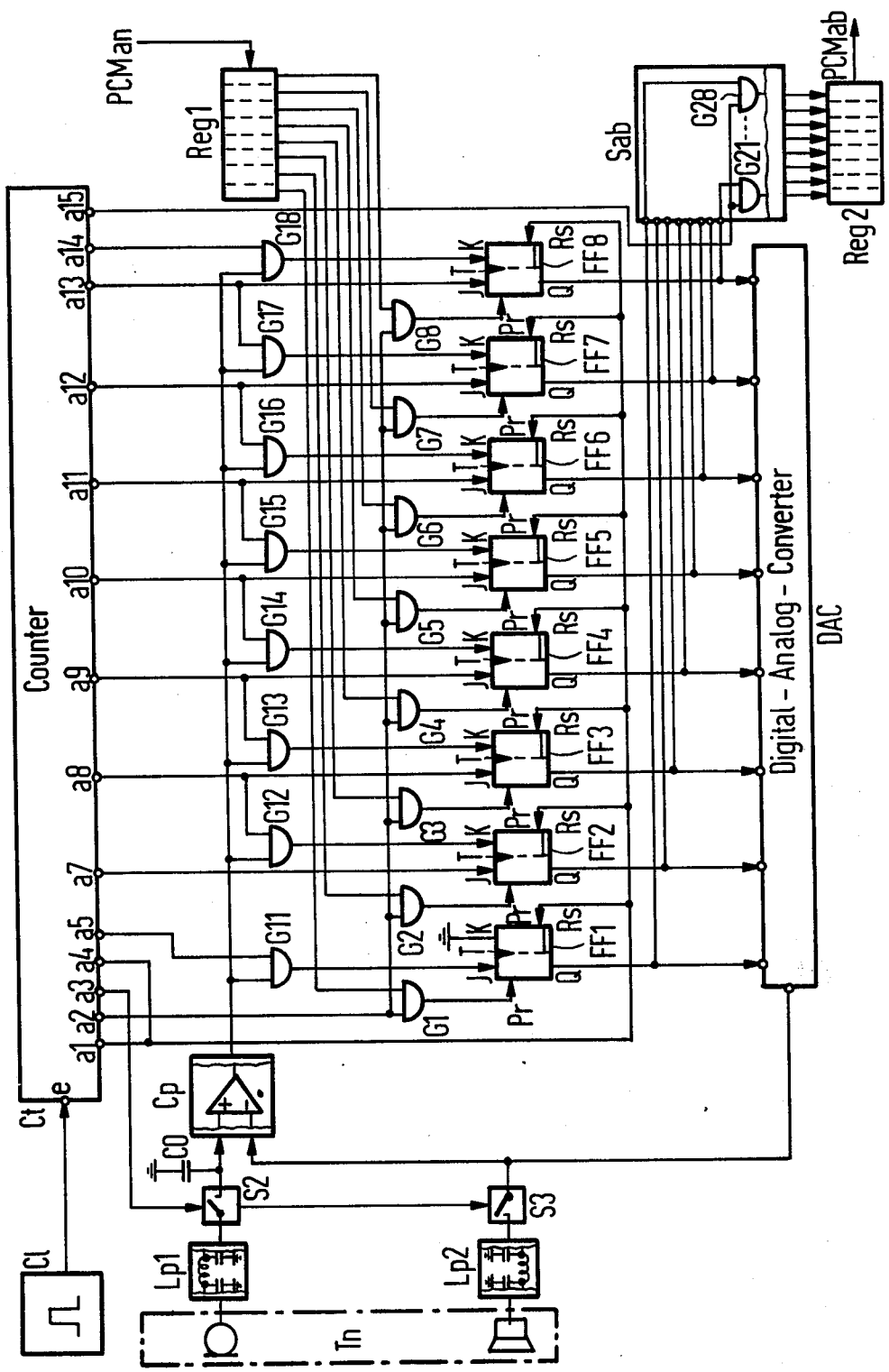

REVERSIBLE ANALOG TO DIGITAL CONVERTER

BACKGROUND OF THE INVENTION

The invention relates to a switching arrangement for converting analog signals, more particularly pulse amplitude modulation (PAM) signals, into digital signals, more particularly pulse code modulation (PCM) signals, and for converting the digital signals into analog signals. The invention has particular application in telecommunication installations having telephone stations, each having a transmitting unit providing analog signals and a receiving unit receiving analog signals.

A PCM scaling and coding circuit has become known (U.S. Pat. No. 3,594,765), wherein the analog signals to be coded are compared with a reference voltage varying in time and in the same direction, whereby during each comparison period a scaler counts from zero. If there is agreement between an analog signal to be coded and the reference voltage, the instantaneous counter position of the counter is stored; the counter position indicates the PCM word corresponding to the analog signal being coded.

In the switching arrangement of known construction the counter is further utilized for converting a PCM signal into an analog signal, whereby the counter is preset by the PCM signal to be converted in each case and then reset in a cyclic operation to its zero position. A signal occurring when this zero position is reached is used for defining the leading edge of a pulse-length-modulated signal. The trailing edge of such a pulse-length-modulated signal is defined by the end of the transmission cycle. The pulse-length-modulated signal is then converted into a PAM signal in a manner in itself know. Thus, the counter may be employed either during the conversion of an analog signal into a PCM signal or during the conversion of a PCM signal into a PAM signal. However, sometimes this takes a considerable amount of time.

Another switching arrangement is known for converting analog signals into PCM signals, using a non-linear characteristic and for converting PCM signals into analog signals, more particularly into PAM signals, using a non-linear characteristic (West German Unexamined Patent Application 2,333,299). In this known switching arrangement a comparison is made in an analog comparator, with a view to converting a PAM signal into a PCM signal, between a voltage varying with time along the non-linear characteristic and the PAM signal. If there is agreement between the PAM signal and the voltage varying with time, the analog comparator stops a memory circuit, which continually stores a code chain corresponding to the particular amplitude of the voltage involved. To convert the PCM signals into PAM signals, a voltage is used having an amplitude characteristic corresponding to the non-linear characteristic. To supply the voltages there is provided a single function generator which produces a voltage varying with time and corresponding to the non-linear characteristic, as far as its characteristic is concerned and which is activated by a clock-controlled counter for the delivery of the voltage. A code chain corresponding to the particular amplitude of the voltage involved is provided in the counter.

There is further connected to the counter a digital comparator which compares the PCM signals to be converted into PAM signals with all possible counter code chains and which in case of agreement between the particular PCM signal and one of said code chains causes the delivery as a PAM signal of the voltage of the function generator existing at the particular time. Although the switching arrangement just described can be utilized for the simultaneous conversion of a PAM signal into a PCM signal and of a PCM signal into a PAM signal, and although the counter provided for the switching arrangement concerned is provided as a single counter, the overall circuit complexity required is still excessive.

It is, therefore, an object of the invention to provide a relatively uncomplex circuit arrangement for converting in a simple manner analog signals into digital signals and digital signals into analog signals.

SUMMARY OF THE INVENTION

In accordance with the invention, the foregoing and other objects are achieved with a switching arrangement of the type discussed hereinabove through the use of an analog-to-digital converter allocated to, for example, individual telephone stations and operating according to the iterative principle. The converter includes a counter, an intermediate register controlled by the counter signals thereof, a digital-to-analog converter following the intermediate register, and a comparator connected by one input to the output of the digital-to-analog converter. Analog signals to be converted into digital signals are applied at another input to the comparator which is capable of controlling by means of its output signal the delivery of the counter signals to the intermediate register. The digital signal to be converted into an analog signal, which is, for example, to be applied to the receiving unit of the telephone station, is converted in the associated digital-to-analog converter during a period corresponding to one pulse frame within a subinterval after it is coupled into the intermediate register. Within another subinterval the analog signal to be converted into a digital signal and delivered from the associated transmitting unit of the telephone station is converted in the associated analog-to-digital converter.

The invention has the advantage that an analog-to-digital converter working along the iterative principle for the conversion of analog signals into digital signals and digital signals into analog signals within a pulse frame can fairly simply be utilized within a pulse frame within which there appears a control pulse of a pulse train allocated to the particular telephone station, for example, for connection with another telephone station. One can conveniently manage with one such converter per subscriber station so as to interconnect subscriber stations on a four-wire basis in a conventional way. This means that the converter associated with the particular telephone station is twice exploited within each pulse frame of the control pulses of the control pulse train allocated to the particular telephone station.

According to an advantageous development of the invention, both subintervals are defined by different counter positions of the counter such that the first subinterval has a shorter duration than the second subinterval. This results in the advantage of a particularly favorable utilization of the available time for converting an analog signal into a digital signal and a digital signal into an analog signal.

According to another advantageous development of the invention, the second subinterval is such that it does not start until the expiration of a signal pause after the first subinterval. This results in the advantage that one assures in a relatively easy way that at the start of the second subinterval the digital-to-analog converter returns to its initial position, so that the signals can be converted faultlessly.

In accordance with the invention the aforementioned counter is so designed that in specified counter positions it clears the application of a digital signal to be converted into an analog signal to the digital-to-analog converter, and in other specified counter positions it enables the inclusion of the digital-to-analog converter for converting an analog signal into a digital signal. The inputs of an output register are connected to the outputs of the register stages of the intermediate register; the digital signal is delivered from the output register. The outputs of an input register are connected to the set inputs of the register stages of the intermediate register, with the converted digital signal being provided from said output register. The outputs of an input register are connected to the set inputs of the register stages of the intermediate register, with the digital signals to be converted into analog signals being applied to said input register.

As a result, relatively little circuit complexity is involved for the conversion of an analog signal into a digital signal and for the provision of such a digital signal both for the reception of a digital signal to be converted into an analog signal and for the conversion of such a digital signal, because in addition to the analog-to-digital converter, which may be of conventional construction, only one input register and one output register are needed.

According to another advantageous development of the invention, the register stages of the intermediate register are connected by reset inputs to a first counter output, which provides a first counter output signal within a counting cycle. In this way it is easily ensured that at the beginning of a counting cycle corresponding to a conversion cycle the register stages of the shift register are in a given output state.

According to another advantageous development of the invention, the outputs of the register stages of the input register are connected to the set inputs of the register stages of the intermediate register by means of logic elements which are connected by means of trigger inputs to a second counter output delivering a second counter output signal within a counting cycle. This ensures relatively easily the the acceptance of a digital signal to be converted into an analog signal by the intermediate register at a given time.

According to still another advantageous development of the invention, there are connected to a third counter output carrying a third counter output signal within a counting cycle the operating input of a gate connecting the output of the digital-to-analog converter to the receiving unit of the telephone station for the reception of analog signals and the operating input of a gate connecting the associated transmitting unit of the telephone station to the one input of the comparator of the analog-to-digital converter. In this way, one ensures relatively easily the reception of an analog signal corresponding to a digital signal through the associated telephone station and the delivery of an analog signal to be converted into a digital signal from the associated telephone station.

According to yet another advantageous development of the invention, the register stages of the intermediate register are connected with their reset inputs to a fourth counter output carrying a fourth counter output signal within a counting cycle. This results in the advantage that following the previous conversion of a digital signal into an analog signal one ensures that the register stages of the intermediate register are each placed in a specified starting condition for the current conversion of an analog signal into a digital signal.

According to still another advantageous development of the invention there is connected to a fifth counter output carrying a fifth counter output signal in a counting cycle the register stage of the intermediate register in which a status signal can be stored specifying the polarity of the analog signal to be converted. In this way, one can easily determine in the associated digital-to-analog converter the polarity of the output signal to be delivered therefrom.

According to still another advantageous development of the invention, the remaining register stages of the intermediate register are connected at the input end to counter outputs which, starting with the seventh counter output signal, carry within a counting cycle a number of successive counter output signals corresponding to the number of the remaining register stages in the intermediate register. Since the sixth counter position of the counter is not used for the delivery of a counter output signal to one of the register stages of the intermediate register it is ensured relatively easily that sources of voltage or current employed in the digital-to-analog converter can generate a constant output voltage or a constant current at the time of activation.

According to still another advantageous development of the invention there are connected to the counter output carrying the last counter output signal within a counting cycle the trigger inputs of logic elements connecting the outputs of the register stages of the intermediate register to the inputs of the output register. In this way it is easily ensured that the digital signal code chain corresponding to the analog signal converted in each case is written into the output register.

BRIEF DESCRIPTION OF THE DRAWING

The principles of the invention will be more readily understood by reference to the description of a preferred embodiment given hereinbelow in conjunction with the accompanying drawing which is a schematic diagram of a switching arrangement constructed according to the invention.

DETAILED DESCRIPTION OF THE PREFERRED EMBODIMENT

The drawing illustrates schematically a telephone station Tn having a transmitting unit shown in the upper part of the figure and a receiving unit shown in the bottom part of the figure. The telephone station TN, which is preferably a telephone station of a PCM/TDM telephone switching system, is connected by its transmitting unit to a capacitor Co by means of a low-pass silter Lp1 and a switch S2. One input of a comparator Cp, which is a conventional analog comparator, is connected to the capacitor Co. The comparator Cp may, for example, comprise a differential amplifier which is connected with its noninverting input (+) to the capacitor Co. The comparator Cp is connected by its inverting input to the output of a digital-to-analog converter DAC.

Logic elements G11 to G18, formed by AND elements, are connected respectively, by one input each to the output of the comparator Cp. Thus, these inputs of the AND elements G11 to G18 constitute to a certain extent trigger inputs. The AND elements G11 to G18 are connected respectively, by their other inputs to outputs $a5$, $a7$, $a8$, $a9$, $a10$, $a11$, $a12$, $a13$ or $a14$ of a counter Ct. In the present case, the counter Ct is a 16-step 1-out-of-$n$ counter. The AND elements G11 to G18 are connected by their outputs to one input each of multivibrators FF1 to FF8. The multivibrators FF1 to FF8 form register stages of an intermediate register. The multivibrators FF1 to FF8 may be conventional JK multivibrators; they have control inputs J and K, a clock pulse input T, a set input Pr and a reset input Rs as well as an output Q.

Of the AND elements G11 to G18, the AND element G11 is connected by its output to the J input of the multivibrator FF1; in contrast, the AND elements G12 to G18 are connected by their outputs to the K inputs of the multivibrators FF2 to FF8.

The K input of the multivibrator FF1 is returned to ground. The J inputs of the multivibrators FF2 to FF8 are connected directly to the outputs $a7$ to $a13$ of counter Ct. The clock pulse inputs T of the multivibrators FF1 to FF8 are connected to the output of a clock generator C1 (not shown in detail), preferably via a switch S1. The set inputs Pr of the multivibrators FF1 to FF8 are connected to the outputs of other logic elements G1 to G8, which may likewise be formed from AND elements. One input each of the AND elements G1 to G8 are connected in common to an output $a2$ of the counter Ct. The other inputs of the AND elements G1 to G8 are connected to the outputs of the register stages of an input register Reg1, which is connected at the input end to a lead PCMan over which digital signals to be converted into analog signals are applied from a signal output unit to an input register Reg1. In the present case, the digital signals may be PCM signals. Hence, the input register Reg1 has a number of register stages corresponding to the number of bits producing a PCM word. The AND elements G1 to G8 are connected by their aforesaid other inputs to the outputs of the register stages of the input register Reg1 so that the sequence of significance of the individual bits of the digital signal to be converted is duly considered during the digital-to-analog conversion to be carried out.

The multivibrators FF1 to FF8 are all connected by their reset inputs Rs to one counter output $a1$ and to one counter output $a4$ of the counter Ct.

The multivibrators FF1 to FF8 are connected by their outputs Q to different inputs of digital-to-analog converter DAC. In response to the code chain applied thereto the digital-to-analog converter has the function of delivering an analog output signal corresponding thereto. To this end, the digital-to-analog converter may be constructed in the form of a conventional R-2R network wherein constant currents of of different constant-current generators may be applied to the junction points of the individual resistors. The constant-current generators may be effectively controlled by the bits of the digital signal to be converted. Such a digital-to-analog converter is, for example, disclosed in British Pat. No. 1,158,453, FIG. 2; it is capable of converting the digital signal applied thereto into an appropriate analog signal, taking into account a non-linear characteristic.

Furthermore, one input each of logic elements G21 to G28 are connected to the Q outputs of the multivibrators FF1 to FF8. These logic elements may likewise be constructed as AND elements. The AND elements G21 to G28 are all connected by their other inputs to an output $a15$ of the counter Ct. The AND elements G21 to G28 are connected by their outputs to the inputs of a register stage of register stages forming an output register Reg2. The Q outputs of the multivibrators FF1 to FF8 are connected to the inputs of the output register Reg2 in such a sequence that the bits of the digital signals delivered from the output register Reg2 appear in the same sequence of significance in which appear the bits of digital signals applied to the input register Reg1. The output register Reg2 which has a number of register stages corresponding to the number of bits producing a digital signal is connected at the output end to a lead PCMab over which digital signals can be delivered to a signal receiving unit, such as to a switching arrangement corresponding to the switching arrangement under consideration.

In the present case, these digital signals may be PCM signals. The aforementioned AND elements G21 to G28, which are capable of transmission at specified times only, are associated with a signal output circuit Sab.

The aforementioned receiving unit of the telephone station Tn is connected to the output of the digital-to-analog converter DAC over a low-pass filter Lp2 and a switch S3. The switch S3 and the switch S2 mentioned earlier are connected by their operating inputs to an output $a3$ of the counter Ct. The counter Ct is connected by one counting input $e$ directly to the output of the clock generator C1 mentioned above.

The switching arrangement described above and comprising the counter Ct, the intermediate register containing the multivibrators FF1 to FF8, the digital-to-analog converter DAC following the intermediate register and the comparator Cp, which is connected by one input to the output of the digital-to-analog converter DAC and by its other input to the source of analog signals to be converted into digital signals which allow at the output end the control of the output of the counter signals to the aforesaid intermediate register over the logic elements G11 to G18, constitutes an analog-to-digital converter working in accordance with the iterative principle. In the telecommunication system, the analog-to-digital converter is provided at the telephone station level.

After explaining the construction of the switching arrangement shown in the drawing, its operating mode will now be discussed. However, it must first be pointed out that the frequency of the clock pulses generated by the clock generator C1 and the construction of the counter Ct are such that during use counter output signals occur at the individual counter outputs at a given rate. This rate corresponds to the frequency at which digital signals occur on the leads PCMan and PCMab of the telecommunication system; for example, it may last 125 us. This value corresponds to the pulse frame period in conventional PCM time division telephone switching systems.

It will be assumed that there shall be transmitted from the telephone station Tn an analog signal, which is converted into a digital signal and transmitted as such to a signal receiving unit, and that a digital signal is applied from a signal output unit to the input register Reg1 of the described switching arrangement, which digital signal is converted into an analog signal to be applied to the telephone station. It must be pointed out, however, that the described switching arrangement also operates in similar fashion, even if either only the telephone station supplies analog signals to be converted into digital signals or only the receiving register R1 supplies digital signals to be converted into analog signals.

Due to the clock pulses provided by the clock generator C1, which, moreover, may be utilized for a multiplicity of corresponding switching arrangements, to the counter input e of the counter Ct, the latter continually sends consecutive counter output signals to its outputs. Assume that the counter Ct is just in its output counter position in which no counter output signal is transmitted by any of the outputs shown in the drawing. Thus, a new counting cycle is running and, thereby, a conversion cycle corresponding thereto. In the course of the counting cycle now running, counter output signals occur individually one after the other at the marked counter outputs $a1$ to $a5$, as well as, $a7$ to $a15$ of the counter Ct. The counter output signals may occur in succession in a sequence which corresponds to the marking of the outputs of the counter Ct. Hence, a counter output signal will appear within each counting cycle at the counter output $a1$. Then, a counter output signal will appear at the counter output $a2$, etc. until finally a counter output signal appears at the counter output 15. The counter output signal appearing at the counter output $a15$ is the last counter output signal within each counting cycle. After the appearance of the last counter output signal, a counter output signal again appears at the counter output $a1$, thereby starting a new counting cycle. The counter output signals at the individual counter outputs may last as long as each of the clock pulses provided by the clock generator C1. Moreover, they may have a different period than the bits of the digital signals, more particularly PCM signals, occurring on the leads PCMan and PCMab.

With the appearance of a first counter output signal at the counter output $a1$ within the counting cycle under consideration, the multivibrators FF1 to FF8, i.e., the register stages of the intermediate register of the analog-to-digital converter, are cleared to zero or reset to their starting condition. With the appearance of the second counter output signal at the counter output $a2$ within the counting cycle under consideration the AND elements G1 to G8 are made capable of transmission. As a result, the bits of the digital or PCM signal contained in the input register Reg1 and to be converted into an analog signal are applied to the set inputs of the multivibrators FF1 to FF8. The multivibrators FF1 to FF8 are set when the bit applied thereto is a "1" bit; they remain in their condition reached earlier when the bit applied to their associated set input is a "0" bit. This means that with the appearance of the aforesaid second counter output signal the digital or PCM signal contained in the input register Reg1 is written into the intermediate register containing the multivibrators FF1 to FF8. The signals appearing as a result at the Q outputs of the multivibrators FF1 to FF8 control the digital-to-analog converter DAC and cause the digital-to-analog converter to provide at its output an analog output signal corresponding to the digital signal.

The switches S2 and S3 are closed with the occurrence of the third counter output signal within the counting cycle under consideration at the counter output $a3$. The analog output signal still provided at this time by the output of the digital-to-analog converter, the multivibrators FF1 to FF8 are still in their previously set condition are coupled to the gate S3 and the low-pass filter Lp2 to the receiving unit of the telephone station Tn. Furthermore, due to the closing of the gate S2 the analog signal provided by the transmitting unit of the telephone station Tn is applied by means of the low-pass filter Lp1 of the capacitor Co across which there is now applied a voltage corresponding to the instantaneous amplitude of the analog signal i.e., a PAM signal.

With the appearance of the fourth counter output signal within the counting cycle under consideration at the counter output $a4$ the multivibrators FF1 to FF8 of the intermediate register are again reset to zero. In addition, the gates S2 and S3 are opened again. In this way, within the counting cycle in a (first) subinterval during which counter output signals appear at the outputs $a1$ to $a4$ (to be more precise, at the outputs $a2$ and $a3$) of the counter Ct, a digital signal formed by a PCM signal has been converted into an analog signal which is passed on as a PAM signal to the receiving unit of the associated telephone station Tn.

This (first) subinterval is immediately followed by another (second) subinterval. Counter output signals appear at the counter outputs $a5$ and $a7$ to $a14$ during this subinterval of the counting cycle. The interval during which a counter output signal occurs at the counter output $a4$ may be looked upon as a no-current period or a signal pause between the first and second subintervals of a counting cycle.

The AND element G11 is rendered operative with the occurrence of the fifth counter output signal within the counting cycle at the counter output $a5$. The output signal of the comparator Cp is applied to the other input of the AND element G11. This output signal specifies the polarity of the analog signal to be converted, since the digital-to-analog converter DAC first delivers a zero output signal. The multivibrator FF1 of the intermediate register is set as a function of this polarity or it remains in its reset state. The state of the multivibrator FF1, after the appearance of the fifth counter output signal, determines whether constant-current generators of one or the other polarity are turned on in the digital-to-analog converter DAC.

No counter output signal is provided in the next counter position of the counter Ct, because it must be ensured that as the next counter output signal starts appearing at the counter output $a7$ the constant-current generators turned on earlier are indeed capable of providing constant currents, i.e., switching transients have already decayed. When, thereafter, counter output signals appear successively at the counter outputs $a7$ to $a14$, the digital-to-analog converter DAC is activated such that the amplitude of its analog output signal is gradually matched to that of the analog signal to be converted and recorded on the capacitor Co. The principle of this conversion process, also known as iterative operation, is old (cf. West German Unexamined Patent Application 2,315,986, FIG. 1; U.S. Pat. No. 3,234,544) and, hence, needs no further explanation.

When a counter output signal appears at the counter output $a14$, the multivibrators FF1 to FF8 of the intermediate register provides bits at its Q outputs, all of which produce a digital signal corresponding to the analog signal recorded on the capacitor Co. The AND elements G21 to G28 are rendered operative with the appearance of the last counter output signal at the counter output $a15$. As a result, the bits provided by the multivibrators FF1 to FF8 are now written into the register stages of the output register Reg2. In this way, the digital signal corresponding to the analog signal is made available for transmission over the lead PCMab to a signal receiving unit. When a counter output signal appears at the counter output a15, a new counting cycle is initiated, resulting in the processes described hereinabove.

It has heretofore been assumed that the counter Ct was in its output counter position at the start of the two conversion processes (conversion of a digital signal into an analog signal and conversion of an analog signal into a digital signal). However, it should be noted that the switching arrangement described hereinabove works in similar fashion when the counter Ct, prior to the conversion process, provides a counter output signal from one of its outputs a1, a4, a5 or a7 to a15, because if a counter output signal is provided from the output a, the counter output signal appearing immediately thereafter at the output a2 would control in the above described manner the acceptance and conversion of a digital signal from the input register Reg1. Moreover, the counter output signals appearing thereafter at the other outputs of the counter would perform the functions described earlier, i.e., control the conversion of an analog signal into a digital signal. If a counter output signal appeared at one of the outputs a4, a5 or a7 to a15, there would be no conversion of a digital signal retained in the input register Reg1 into an analog signal, nor would an analog signal provided by the associated telephone station be converted into a digital signal. However, if the counter Ct provides a counter output signal to its output a2 prior to a conversion then, within the ongoing counting cycle, only an analog signal provided by the associated telephone station Tn will be converted into a digital signal, and not until the start of the following counting cycle will a digital signal held in the input register Reg1 be converted by the switching arrangement considered into an analog signal to be applied to the associated telephone station. In this case, the two subintervals mentioned hereinabove, within which the conversions take place, follow each other in a different sequence.

In conclusion, it should be noted that the switching arrangement described hereinabove, apart from the centrally utilized clock generator C1, the telephone station Tn and the low-pass filters Lp1 and Lp2, is particularly suitable for integrated fabrication in a single, unitary semiconductor structure. It should also be noted that in deviation from the circumstances above discussed the counter Ct1 provided for the switching arrangement constructed according to the invention may be designed as a 4-stage binary counter with subsequent decoder, which provides an output signal at one of sixteen outputs whereby, in a manner similar to that described above, particular output signals are not utilized (via. in the counter positions "zero" and "six"). Other deviations from the described, exemplary embodiment or its principles of operation will be obvious to those skilled in the art. However, it is to be remembered that the scope of the invention is defined by the appended claims, and any such changes or modifications will be within the claims.

I claim:

1. Apparatus for converting analog signals from a source thereof into digital signals for transmission and transmitted digital signals into analog signals for an analog receiver, comprising:
   digital to analog converter means,
   comparator means having a first input connected to an output of said digital to analog converter means and a second input connected to receive said analog signals from said source,
   a multistage binary counter,
   intermediate register means having a plurality of bistable stages,
   first logic means coupled to receive an output from said comparator means and to enable communication of outputs from predetermined ones of said stages of said counter to respective ones of said stages of said intermediate register,
   means coupled to a first predetermined stage of said binary counter and responsive to an output signal therefrom for enabling the communication of a digital signal to be converted to said digital to analog converter during a first interval when a digital to analog conversion is to take place
   gate means coupled to a second predetermined stage of said binary counter and responsive to an output signal therefrom for rendering said digital to analog converter operative during an interval when an analog to digital conversion is to take place,
   output register means having inputs connected, respectively, to outputs of said intermediate register for producing output digital signals, and
   input register means having an input for receiving digital signals to be converted and outputs connected, respectively, to set inputs of said bistable stages of said intermediate register means.

2. The apparatus defined in claim 1 wherein said bistable stages of said intermediate register means have reset inputs connected to a third predetermined output of said binary counter.

3. The apparatus defined in claim 2 wherein said reset inputs to said bistable stages are connected additionally to a sixth output from said binary counter.

4. The apparatus defined in claim 1 wherein the outputs of said input register are connected to the set inputs of said intermediate register by means of second logic means having enabling inputs connected to a fourth predetermined output of said binary counter.

5. The apparatus defined in claim 1 further comprising switch means operative responsive to a fifth predetermined output from said binary counter for connecting an analog output from said digital to analog converter to said analog receiver.

* * * * *